(12) United States Patent
Dzienis et al.

(10) Patent No.: US 10,598,717 B2
(45) Date of Patent: *Mar. 24, 2020

(54) METHOD, DEVICE AND SYSTEM FOR DETERMINING THE FAULT LOCATION OF A FAULT ON A LINE OF AN ELECTRICAL ENERGY SUPPLY NETWORK

(71) Applicant: SIEMENS AKTIENGESELLSCHAFT, Munich (DE)

(72) Inventors: Cezary Dzienis, Dallgow-Doeberitz (DE); Andreas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/405,941

(22) Filed: Jan. 13, 2017

(65) Prior Publication Data

US 2017/0199237 A1    Jul. 13, 2017

(30) Foreign Application Priority Data

Jan. 13, 2016   (EP) .................................... 16151071

(51) Int. Cl.
*G01R 31/08*  (2020.01)
*H02H 3/30*  (2006.01)
(Continued)

(52) U.S. Cl.
CPC ......... *G01R 31/085* (2013.01); *G01R 31/088* (2013.01); *G01R 31/11* (2013.01); *H02H 3/30* (2013.01); *H02H 7/265* (2013.01)

(58) Field of Classification Search
CPC .... G01R 31/085; G01R 31/08; G01R 31/086; G01R 31/40; G01R 31/025; H02H 7/265; H02H 7/26; Y04S 10/522
See application file for complete search history.

(56) References Cited

U.S. PATENT DOCUMENTS

| 4,996,624 A | 2/1991 | Schweitzer, III |
| 5,929,642 A | 7/1999 | Philippot et al. |

(Continued)

FOREIGN PATENT DOCUMENTS

| CN | 101216524 A | 7/2008 |
| CN | 101981774 A | 2/2011 |

(Continued)

*Primary Examiner* — Patrick Assouad
*Assistant Examiner* — Feba Pothen
(74) *Attorney, Agent, or Firm* — Laurence Greenberg; Werner Stemer; Ralph Locher

(57) ABSTRACT

A fault location of a fault on a line of an electrical energy supply network is determined from measured current and voltage values at the first and second line ends. Highly accurate fault location with measured values from both line ends is provided even in the absence of temporal synchronization of the measurements at the line ends. Characteristics of first and second fictitious fault voltage values present at a fictitious fault location on the line are defined using the first and second current and voltage values. A fictitious fault location is determined for which the characteristic of the first fictitious fault voltage values corresponds most closely to the characteristic of the second fictitious fault voltage values. The fictitious fault location is used as the actual fault location. We also describe a correspondingly configured device and a system for determining a fault location.

13 Claims, 11 Drawing Sheets

(51) Int. Cl.
*H02H 7/26* (2006.01)
*G01R 31/11* (2006.01)

(56) References Cited

U.S. PATENT DOCUMENTS

| | | | |
|---|---|---|---|
| 8,655,609 B2 | 2/2014 | Schweitzer, III et al. | |
| 2010/0301872 A1* | 12/2010 | Kereit | H02H 3/40 |
| | | | 324/521 |
| 2011/0109465 A1 | 5/2011 | Jurisch | |
| 2012/0068717 A1 | 3/2012 | Gong et al. | |
| 2013/0107405 A1* | 5/2013 | Blumschein | G01R 31/025 |
| | | | 361/79 |
| 2015/0081235 A1 | 3/2015 | Schweitzer, III et al. | |
| 2015/0081236 A1 | 3/2015 | Schweitzer, III et al. | |
| 2015/0233976 A1* | 8/2015 | Johannesson | G01R 15/18 |
| | | | 324/764.01 |

FOREIGN PATENT DOCUMENTS

| | | |
|---|---|---|
| CN | 103176107 A | 6/2013 |
| CN | 103513159 A | 1/2014 |
| EP | 2476002 B1 | 5/2015 |
| WO | 2012126526 A1 | 9/2012 |

\* cited by examiner

METHOD, DEVICE AND SYSTEM FOR DETERMINING THE FAULT LOCATION OF A FAULT ON A LINE OF AN ELECTRICAL ENERGY SUPPLY NETWORK

CROSS-REFERENCE TO RELATED APPLICATION

This application claims the priority, under 35 U.S.C. § 119, of European patent application EP 16151071.4, filed Jan. 13, 2016; the prior application is herewith incorporated by reference in its entirety.

BACKGROUND OF THE INVENTION

Field of the Invention

The invention relates to a method for determining the fault location of a fault on a line of an electrical energy supply network in which first current and voltage values are measured at a first line end of the line, second current and voltage values are measured at a second line end of the line and the location of the fault is defined using the first and second current and voltage values following the occurrence of a fault on the line.

The invention also relates to a corresponding device and a system for determining the fault location of a fault on a line of an electrical energy supply network.

The safe operation of electrical energy supply networks requires the fast and reliable detection and shutdown of any faults, such as, for example, short circuits or grounding faults. Causes of faults which result in a shutdown may, for example, be lightning strikes, torn or otherwise damaged lines, defective insulations in cable lines or the unwanted contact of overhead lines with animal or plant parts. In order to shorten fault-related downtimes, faults of this type must be localized as accurately as possible in order to enable an elimination by a maintenance team of the fault cause and any consequential damage caused by the fault.

In the simplest, but also most expensive, case, a fault is located by means of visual inspection. The maintenance team passes along the defective line and examines it for visible fault points. This procedure is slow and prone to error.

A different procedure has therefore largely been adopted, whereby the fault location at which the fault on the line is located is isolated by way of an analysis of measurement values, e.g. currents and voltages measured during the fault occurrence. A plurality of different methods have since become known for this purpose, the accuracy of which impacts significantly on the maintenance cost of the energy supply network. Great importance is therefore attached to improving the accuracy of the algorithms used for the fault location in order to simplify the maintenance and, in particular, shorten fault-related downtimes of the energy supply network.

A rough result of the fault location can be achieved, for example, by identifying the fault direction. This method is used primarily in compensated, isolated and high-impedance-grounded energy supply networks with a radial structure or a low degree of meshing. A wattmetric method, for example, can be used, as known from the European Patent EP 2 476 002 B1. A different method for detecting the fault direction is the "wiper relay principle" which is known in one possible embodiment, for example, from the international patent application WO 2012/126526 A1. However, an additional evaluation is necessary in these methods for more accurate fault location.

Methods for more accurate fault location use, for example, the measured current and voltage signals of the fundamental wave (50 Hz or 60 Hz signals) for fault location. Here, methods are known which use measured values of only one of the line ends (unilateral fault location) or measured values of both line ends (bilateral fault location). As a result, the fault location is normally indicated as the distance from the respective measuring point (as a percentage of the line or in km or miles).

In the case of the use of measured values of only one line end, the cost of performing the fault location is low. This fault location method is primarily an impedance-based method in which an impedance through to the fault location is calculated from current and voltage measured values. The fault location can be inferred through comparison with the line impedance of the entire line in the fault-free case. An example embodiment of a fault location method of this type can be found, for example, in U.S. Pat. No. 4,996,624.

The accuracy of this method depends, inter alia, heavily on the measurement accuracy of the current and voltage transformers that are used, the accuracy of the line parameters used for the fault location (e.g. impedance per unit length) and on the given fault conditions (e.g. fault resistance, load) and the network characteristics. Faults and the transient responses in the current and voltage signals can have a negative impact on the accuracy of this method. The resulting measurement errors may amount to several percent.

An improved accuracy in the fault location can be achieved through the use of measured values from both line ends. Here, the fault-location-related measured values must be collated via a suitable communication connection. In this context, reference is made to U.S. Pat. No. 5,929,642; in the method described there, a fairly high accuracy (measurement error approximately 1-2%) is achieved in the fault location using current and voltage measured values from both line ends by means of estimation methods and non-linear optimization methods.

Whereas the accuracy of the fault location in the case of impedance-based fault location methods depends on the measurement accuracy of the measuring transformers that are used and the network characteristics, a broad independence from these values can be achieved through the use of a fault location method according to the "traveling wave fault location" principle. According to this principle, the transient signal components produced in the event of a fault and occurring in the form of "traveling waves" are taken into consideration for the fault location instead of the measured current and voltage signals. Here, the high-frequency traveling wave edges are measured and are provided with a timestamp. Since the propagation speed of the traveling waves is approximately equal to the speed of light, the fault can be accurately located from the evaluation of the timestam ping. Accuracies in the range of a few dozen meters can be achieved with this fault location method. An example of a fault location method of this type can be found in U.S. Pat. No. 8,655,609 B2. However, in the known method, a high-precision temporal synchronization between the measuring devices at both line ends must be provided so that uniform timestamps can be allocated. Receivers, for example, of a satellite-based time pulse (e.g. a GPS signal) are necessary here for providing a time signal that is synchronous at both ends.

SUMMARY OF THE INVENTION

It is accordingly an object of the invention to provide a method and a device which overcomes the above-mentioned and other disadvantages of the heretofore-known devices and methods of this general type and which render it possible to perform a fault location with measured values from both line ends with high accuracy even in the absence of temporal synchronization.

With the foregoing and other objects in view there is provided, in accordance with the invention, a method for determining the fault location of a fault on a line of an electrical energy supply network, the method comprising:

measuring first current and voltage values at a first line end of the line;

measuring second current and voltage values at a second line end of the line;

following the occurrence of a fault on the line, defining a series of first fictitious fault voltage values present at a fictitious fault location on the line using the first current and voltage values and a propagation model for traveling waves on the line;

defining a series of second fictitious fault voltage values present at a fictitious fault location on the line using the second current and voltage values and the propagation model for traveling waves on the line;

determining a fictitious fault location of the type on the line for which the series of the first fictitious fault voltage values corresponds most closely to the series of the second fictitious fault voltage values; and defining the fault location of the fault on the line, and thereby using the fictitious fault location as the fault location of the fault on the line.

In other words, the objects of the invention are achieved by the claimed method. According to the invention, a series of first fictitious fault voltage values present at a fictitious fault location on the line is defined using the first current and voltage values and a propagation model for traveling waves on the line, a series of second fictitious fault voltage values present at the fictitious fault location on the line is defined using the second current and voltage values and the propagation model for traveling waves on the line, a fictitious fault location of this type on the line is determined for which the series of the first fictitious fault voltage values corresponds most closely to the series of the second fictitious fault voltage values, and the determined fictitious fault location is used as the fault location of the fault on the line.

The invention is based on the finding that the series of the fault voltage values defined using a propagation model for traveling waves on the basis of the measured values of both line ends correspond to one another only for the actual fault location, and are furthermore shifted by the propagation time of the traveling wave from the fault location to the respective line end. The movement of a traveling wave along the electrical line is described mathematically with the propagation model. The actual fault location can thus be defined with high accuracy through the search for a fictitious fault location for which the series of the fault voltage values defined from both line ends correspond to one another without a costly temporal synchronization of the measurements at the line ends being required for this purpose.

In this specification, the expressions "fault location" and "distance x (or l-x) of the fault location from a line end" are used partially synonymously and are to be understood accordingly.

According to one advantageous embodiment of the method according to the invention, it can be provided that the fictitious fault location on the line for which the series of the first fictitious fault voltage values corresponds most closely to the series of the second fictitious fault voltage values is determined by means of an optimization method, wherein the fictitious fault location is used as an optimization parameter of a target function of the optimization method.

As a result, the actual fault location can be determined at an acceptable processing cost through mathematical optimization (e.g. a minimization or a maximization of the target function).

The optimization method may, for example, be an iterative optimization method.

Specifically, it can be provided, for example, that the fictitious fault location for which a minimum of the difference between the series of the first fictitious fault voltage values and the series of the second fictitious fault voltage values is present is defined with the target function.

Alternatively, it can also be provided, for example, that the fictitious fault location for which a maximum of the product of the series of the first fictitious fault voltage values and the complex-conjugate series of the second fictitious fault voltage values is present is defined with the target function. In this case, the target function describes a cross-power spectrum which is formed in the described manner in the frequency domain. In the time domain, the target function corresponds to a cross-correlation of the fault voltage series defined from both line ends.

In addition, further target functions are also conceivable with which the fictitious fault location can be determined for which the two series of the fault voltage values most closely correspond to one another.

According to a further advantageous embodiment of the method according to the invention, it can furthermore be provided that the current and voltage values measured at the line ends are subjected to a filtering, wherein first and second filtered current and voltage values are formed which indicate a selected frequency range of the measured current and voltage values, and the fictitious first and second fault voltage values are defined using the first and second filtered current and voltage values.

Here, the method according to the invention is advantageously applied to the traveling wave principle for fault location described above by using only selected signal components of the current and voltage measured values in a suitable frequency range for the fault location.

Specifically, it can be provided in this respect that the selected frequency range comprises high-frequency transient components or band-limited transient components of the measured current and voltage values.

In this context, it can furthermore be provided that, in the case of a multiphase electrical energy supply network, in respect of the first and second filtered current and voltage values, a mathematical transformation is performed to decouple the individual conductor signals, wherein first and second transformed current and voltage values are formed, and the fictitious first and second fault voltage values are defined using the first and second transformed current and voltage values.

As a result, the method according to the invention can advantageously be used in—commonplace—multiphase energy supply networks. The measured values of the individual phases are decoupled by the mathematical transformation and can be more simply evaluated. A modal transformation, for example, such as the Clarke transformation or an eigenvalue transformation can be considered for the transformation.

A further advantageous embodiment of the method according to the invention furthermore provides that the determination of the fault location is carried out if a jump which exceeds a predefined threshold has been identified in the series of the first current and voltage values or values derived therefrom and/or in the series of the second current and voltage values or values derived therefrom.

In this way, the fault location method is carried out only in the case of an abrupt series change, such as e.g. in an actually occurring fault event, since the jump in the series of the current and voltage measured values or values derived therefrom (e.g. the afore-mentioned filtered or transformed current and voltage values) normally associated with the fault triggers the performance of the fault location method. Furthermore, the jump detection is used for the correct positioning of the measurement window for the evaluation to determine the fault location.

In order to be able to make a distinction in this context between a fault event that has actually occurred on the line and other events which cause abrupt characteristic changes, the fault distance x determined with the fault location method is evaluated. If this distance is within the line length, i.e. typically between 0 and 1, a fault event is present on the line that is to be monitored; conversely, if it is outside the line, no fault on the line can be assumed.

A further advantageous embodiment of the method according to the invention provides that the fault location is determined at one line end by means of a device configured for this purpose, and the determined fault location is output by the device.

The device may be provided at one of the line ends or may be designed as a central device, e.g. a data processing device in a station or network control center. The determined fault location may, for example, be displayed directly on the device as a percentage of the line length or as a distance from a selected measuring point (e.g. in km or miles) or may be output in the form of a signal or data message and forwarded to an operator of the energy supply network.

Alternatively, it can also be provided that the fault location is determined in each case by means of a device at each of the line ends, and the fault locations determined with the devices are output by the devices.

Here, the fault location determination is carried out at both line ends, in fact on the basis of the same measured values, but nevertheless independently from one another, as a result of which two results of the fault location determination are generated. Partially different algorithms can also be executed in the devices; for example, different optimization methods can be used. The reliability of the result can be inferred from the correspondence of the results from both line ends. The fault location determined at the respective line end may be displayed directly on the device e.g. as a percentage of the line length or as a distance from the respective measuring point (e.g. in km or miles) or may be output in the form of a signal or data message and forwarded to an operator of the energy supply network.

With the above and other objects in view there is also provided, in accordance with the invention, a device for determining the fault location of a fault on a line of an electrical energy supply network, the device comprising:

a processing device configured to receive first current and voltage values measured at a first line end of the line and second current and voltage values measured at a second line end of the line and, following the occurrence of a fault on the line, to determine the fault location of the fault using the first current and voltage values and the second current and voltage values, wherein:

the processing device is configured to define a series of first fictitious fault voltage values present at a fictitious fault location on the line using the first current and voltage values and a propagation model for traveling waves on the line;

the processing device is configured to define a series of second fictitious fault voltage values present at the fictitious fault location on the line using the second current and voltage values and the propagation model for traveling waves on the line; and the processing device is configured to determine a fictitious fault location of this type on the line for which the series of the first fictitious fault voltage values corresponds most closely to the series of the second fictitious fault voltage values, and to indicate the determined fictitious fault location as the fault location of the fault on the line.

In other words, a device is provided for determining the fault location of a fault on a line of an electrical energy supply network, with a processing device which is configured to determine the fault location of said fault using first current and voltage values measured at a first line end of the line and second current and voltage values measured at a second line end of the line following the occurrence of a fault on the line.

In accordance with the invention, the processing device is configured to define a series of first fictitious fault voltage values present at a fictitious fault location on the line using the first current and voltage values and a propagation model for traveling waves on the line and a series of second fictitious fault voltage values present at the fictitious fault location on the line using the second current and voltage values and the propagation model for traveling waves on the line, to determine a fictitious fault location of this type on the line for which the series of the first fictitious fault voltage values corresponds most closely to the series of the second fictitious fault voltage values, and the determined fictitious fault location is used as the fault location of the fault on the line.

With regard to the device according to the invention, all details described above and below for the method according to the invention and vice versa apply accordingly, in particular the device according to the invention is configured to carry out the method according to the invention in any given embodiment or a combination of any given embodiments. Also with regard to the advantages of the device according to the invention, reference is also made to the advantages described for the method according to the invention.

Specifically, it can be provided according to one advantageous embodiment of the device according to the invention that the device is an electrical protection device.

Here, the device may advantageously be formed by an electrical protection device which, along with the fault location, performs further protection and monitoring functions for the electrical energy supply network (e.g. a distance protection function, an overcurrent protection function or a differential protection function for the line). Alternatively, however, it may also be provided that the device is a separate fault-localizing device.

With the above and other objects in view there is also provided, in accordance with the invention, a system for determining the fault location of a fault on a line of an electrical energy supply network in which, according to the invention, two devices, as summarized above, are provided which are interconnected via a communication connection to exchange data.

In terms of the system according to the invention, all details described above and below for the method according to the invention and the device according to the invention and vice versa apply accordingly. Also with regard to the advantages of the system according to the invention, reference is also made to the advantages described for the method according to the invention and the device according to the invention.

The invention is explained in detail below on the basis of an example embodiment. The specific design of the example embodiment is to be understood as in no way limiting for the general design of the method according to the invention and the device according to the invention; instead, individual design features of the example embodiment can be combined freely with one another and with the features described above in any given manner.

Other features which are considered as characteristic for the invention are set forth in the appended claims.

Although the invention is illustrated and described herein as embodied in the method, device and system for determining the fault location of a fault on a line of an electrical energy supply network, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
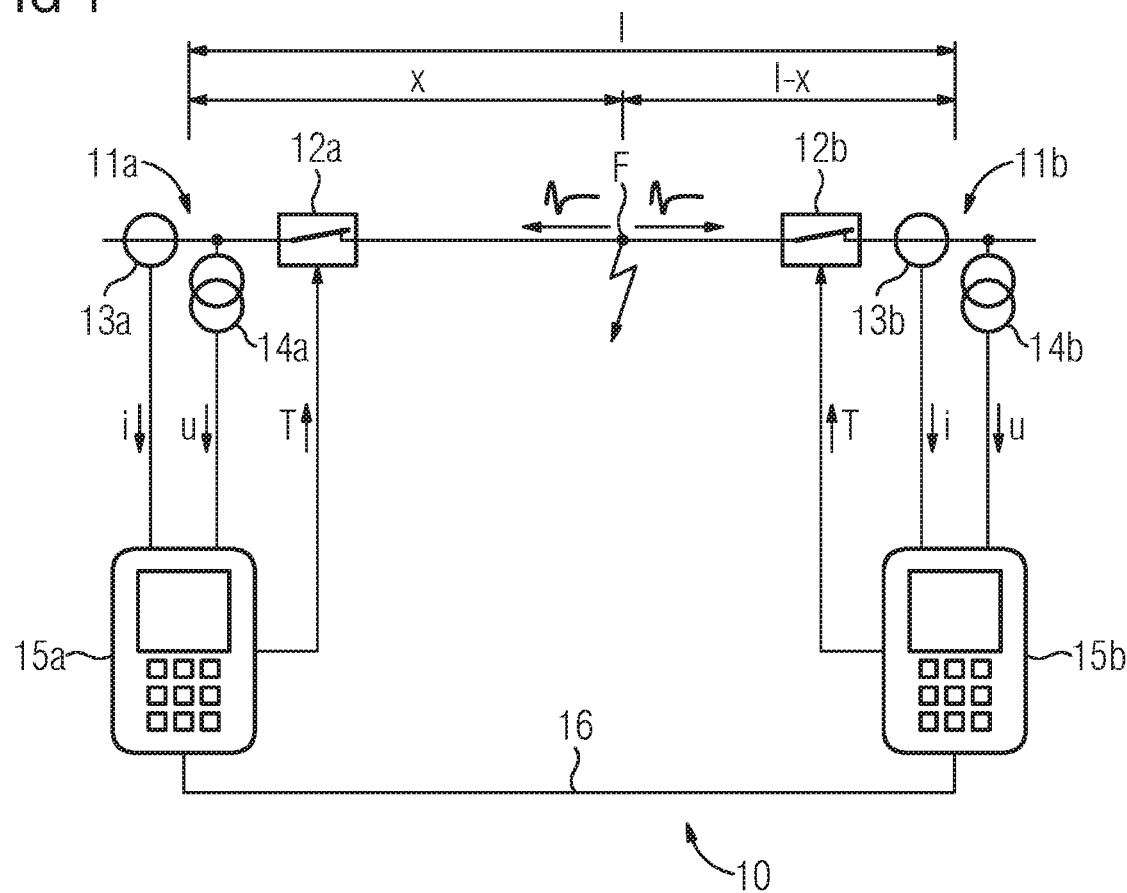
FIG. 1 shows a schematic view of a line of an energy supply network with a system for determining a fault location.

Referring now to the figures of the drawing in detail and first, particularly, to FIG. 1 thereof, there is shown a schematic view of a system 10 for determining a fault location in an electrical energy supply network. For this purpose, FIG. 1 shows a simplified representation of an electrical line 11 of the energy supply network. The line is assumed to have the length l. The line 11 may be a single-phase or multiphase line.

The line 11 is delimited at its line ends 11a and 11b by power switches 12a, 12b and can be disconnected by the latter from the remaining energy supply network (not shown in detail in FIG. 1). Measuring points at which current and voltage measured values are recorded with current transformers 13a, 13b and voltage transformers 14a, 14b shown in FIG. 1 merely by way of example are furthermore present at the line ends 11a, 11b. The current transformers 13a, 13b and the voltage transformers 14a, 14b may be conventional or unconventional transformers. Current measured values i and voltage measured values u, which may be analog or digitized values, are output by the transformers on the secondary side.

Devices 15a, 15b for determining a fault location are connected to the current transformers 13a, 13b and the voltage transformers 14a, 14b at the respective line ends 11a, 11b. These devices 15a, 15b may, for example, be electrical protection devices which, as well as a fault location function, perform other protection and monitoring functions as well. For example, the protection devices may be distance protection devices, differential protection devices or overcurrent protection devices which monitor the operating state of the line 11 on the basis of the recorded current and voltage measured values and, in the event of a fault, transmit a shutdown signal T to their respective power switch 12a, 12b to cause the latter to open its switching contacts.

The devices 15a, 15b are configured, in the event of a fault on the line 11, to determine and output the fault location, i.e. the location on the line at which a fault (e.g. short circuit, earth fault) has occurred. To do this, they use the current and voltage measured values of their own line end and the respective other line end which have been recorded during the fault. For this purpose, the devices 15a, 15b are connected via a communication connection 16, which may be any given suitable wired or wireless communication connection. The devices 15a, 15b can exchange, inter alia, their current and voltage measured values via the communication connection 16 in order to determine the fault location.

The devices 15a, 15b carry out a fault location according to the traveling wave principle. This exploits the fact that, when a fault occurs, high-frequency transient signal components are produced in the current and in the voltage which propagate roughly at the speed of light in both directions on the line 11. This is drawn by way of example in FIG. 1. For this purpose, it is assumed that a fault has occurred at a fault location F. The traveling waves propagate as shown from the fault location F both in the direction of the first line end 11a and in the direction of the second line end 11b and can be measured there with the transformers and can be evaluated with the devices 15a, 15b in order to define the fault location. Seen from the first line end, the fault location F is located at a distance x, and, correspondingly from the perspective of the second line end, the fault location F is located at a distance l-x. As described in detail below, the devices evaluate the current and voltage measured values and output the fault location F, for example as a distance or percentage of the line length l.

The operator of the energy supply network can forward the determined fault location F to a maintenance team which can then visit the fault location and eliminate the cause of the fault. The most accurate possible determination of the fault location is required for this purpose. A procedure for the fault location is described below which, unlike previous traveling wave fault locations, does without temporally synchronized measured values from the line ends 11a, 11b.

A brief explanation of the principle of traveling wave fault location will first be given. For this purpose, a bilateral traveling wave fault location algorithm is explained, i.e. an algorithm which operates with measured values from both line ends 11a, 11b. A propagation model for traveling waves along the line 11 is used. The algorithm used in the method according to the invention furthermore does without time-synchronized measured values.

The "theory of long lines" is used to produce the algorithm concerned. This involves the model-based mapping of an electrical line in the form of "distributed parameters". This is shown by way of example in FIG. 2.

Figure 2:
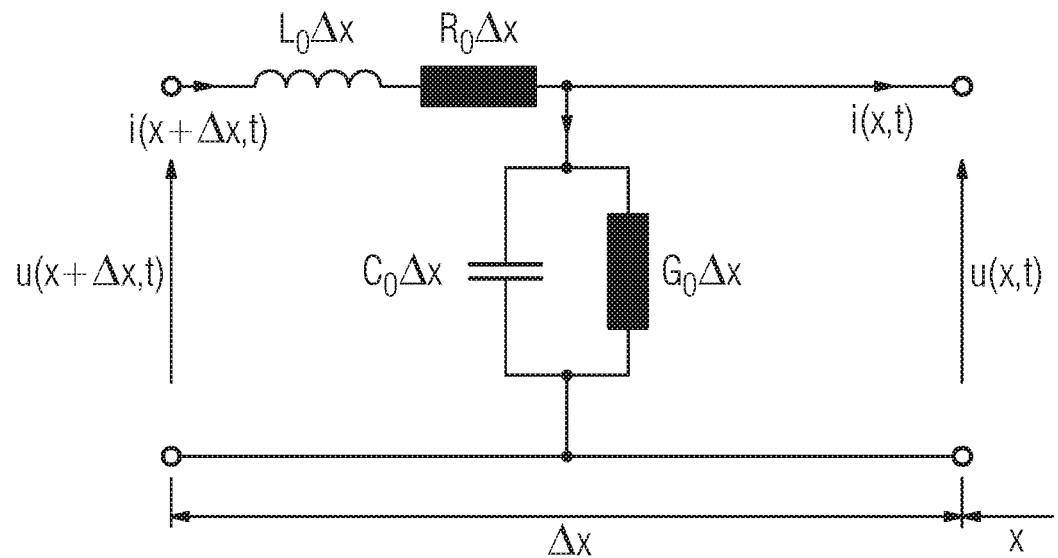
FIG. 2 shows a representation of the electrical parameters of a line section $\Delta x$ to explain the definition of a fault location according to the traveling wave principle.

FIG. 2 shows that the network parameters such as the inductance per unit length $L_0$, capacitance per unit length $C_0$, resistance per line length $R_0$ and conductivity per unit length $G_0$ are distributed along the line. On the basis of this line model, using Kirchhoff's laws for the section $\Delta x$ of the line, the following equations are obtained for the voltage u and the current i:

$$u(x+\Delta x, t) = R_0 \Delta x \cdot i(x+\Delta x, t) + L_0 \Delta x \frac{\partial i(x+\Delta x, t)}{\partial t} + u(x, t) \quad (1)$$

$$i(x+\Delta x, t) = G_0 \Delta x \cdot u(x, t) + C_0 \Delta x \frac{\partial u(x, t)}{\partial t} + i(x, t) \quad (2)$$

Through mathematical transformations, equations (1) and (2) can be converted into the following form:

$$\frac{\partial u(x, t)}{\partial t} = R_0 \cdot i(x, t) + L_0 \frac{\partial i(x, t)}{\partial t} \quad (3)$$

$$\frac{\partial i(x, t)}{\partial x} = G_0 \cdot u(x, t) + C_0 \frac{\partial u(x, t)}{\partial t} \quad (4)$$

These equations (3) und (4) are partial differential equations of a homogeneous line and are normally referred to as "telegraph equations". They can be generalized to apply to any given conductors.

By considering equations (3) and (4) in the Laplace domain, assuming x as a parameter, many effects occurring in the line can be interpreted substantially more simply:

$$\frac{\partial u(x, s)}{\partial x} = R_0 \cdot i(x, s) + sL_0 \cdot i(x, s) \quad (5)$$

$$\frac{\partial i(x, s)}{\partial x} = G_0 \cdot u(x, s) + sC_0 \cdot u(x, s) \quad (6)$$

The derivation of equations (5) und (6) according to parameter x produces the following:

$$\frac{\partial^2 u(x, s)}{\partial x^2} = Z(s)Y(s) \cdot u(x, s) \quad (7)$$

$$\frac{\partial^2 i(x, s)}{\partial x^2} = Y(s)Z(s) \cdot i(x, s) \quad (8)$$

Equations (7) and (8) can be solved separately using the differential equation theory for voltage and current:

$$U(x) = e^{-\gamma(s)x} \cdot A_1 + e^{\gamma(s)x} \cdot A_2 \quad (9)$$

$$Z_c(s) \cdot I(x) = e^{-\gamma(s)x} \cdot A_1 - e^{\gamma(s)x} \cdot A_2 \quad (10)$$

In solving equations (9) und (10), it is possible to calculate the unknown parameters $A_1$ and $A_2$ from the initial conditions:

$$A_1 = \tfrac{1}{2}(U_1(s) + Z_c(s) \cdot I_1(s)) \quad (11)$$

$$A_2 = \tfrac{1}{2}(U_1(s) - Z_c(s) \cdot I_1(s)) \quad (12)$$

wherein $U_1$ and $I_1$ represent the initial conditions at x=0. In addition, equations (9) and (10) contain a wave impedance $Z_c$ and the propagation constant $\gamma$, which can be calculated from the line parameters:

$$\gamma(s)^2 = Z(s)Y(s) \quad (13)$$

$$Z_c(s) = \gamma(s)^{-1} \cdot Z(s) \quad (14)$$

Here, Z represents the line impedance and Y the shunt admittance of a section of the line. The values are indicated in each case in relation to length.

The following forms are thus obtained for equations (9) and (10):

$$U(x,s) = \tfrac{1}{2} e^{-\gamma(s)x} \cdot (U_1(s) + Z_c(s) \cdot I_1(s)) + \tfrac{1}{2} e^{\gamma(s)x} \cdot (U_1(s) - Z_c(s) \cdot I_1(s)) \quad (15)$$

$$Z_c(s) \cdot I(x,s) = \tfrac{1}{2} e^{-\gamma(s)x} \cdot (U_1(s) + Z_c(s) \cdot I_1(s)) - \tfrac{1}{2} e^{\gamma(s)x} \cdot (U_1(s) - Z_c(s) \cdot I_1(s)) \quad (16)$$

Equations (15) and (16) represent a voltage-related or current-related propagation model for traveling waves along the line 11. The fault voltage at the initially unknown fault location F is considered for the traveling wave fault location described here. The relation described in equation (15) is used here.

This voltage equation (15) can be represented in the following form in the Laplace domain:

$$U(x,s) = U_1(s)\cos h\gamma(s)x - Z_c(s) \cdot I_1(s)\sin h\gamma(s)x \quad (17)$$

The transition to the frequency domain is effected by inserting s=jω, where the angular frequency is represented as follows:

$$U(x,j\omega) = U_1(j\omega)\cos h\gamma(j\omega)x - Z_c(j\omega) \cdot I_1(j\omega)\sin h\gamma(j\omega) \quad (18)$$

This produces the analytical equation (18), which is satisfied for each occurring frequency f=ω/2π. For this reason, the consideration can be limited to a selected frequency spectrum. The traveling wave fault location operates in a high-frequency range in which the information relating to the traveling wave propagation and the occurring reflections is significantly pronounced.

Figure 3:
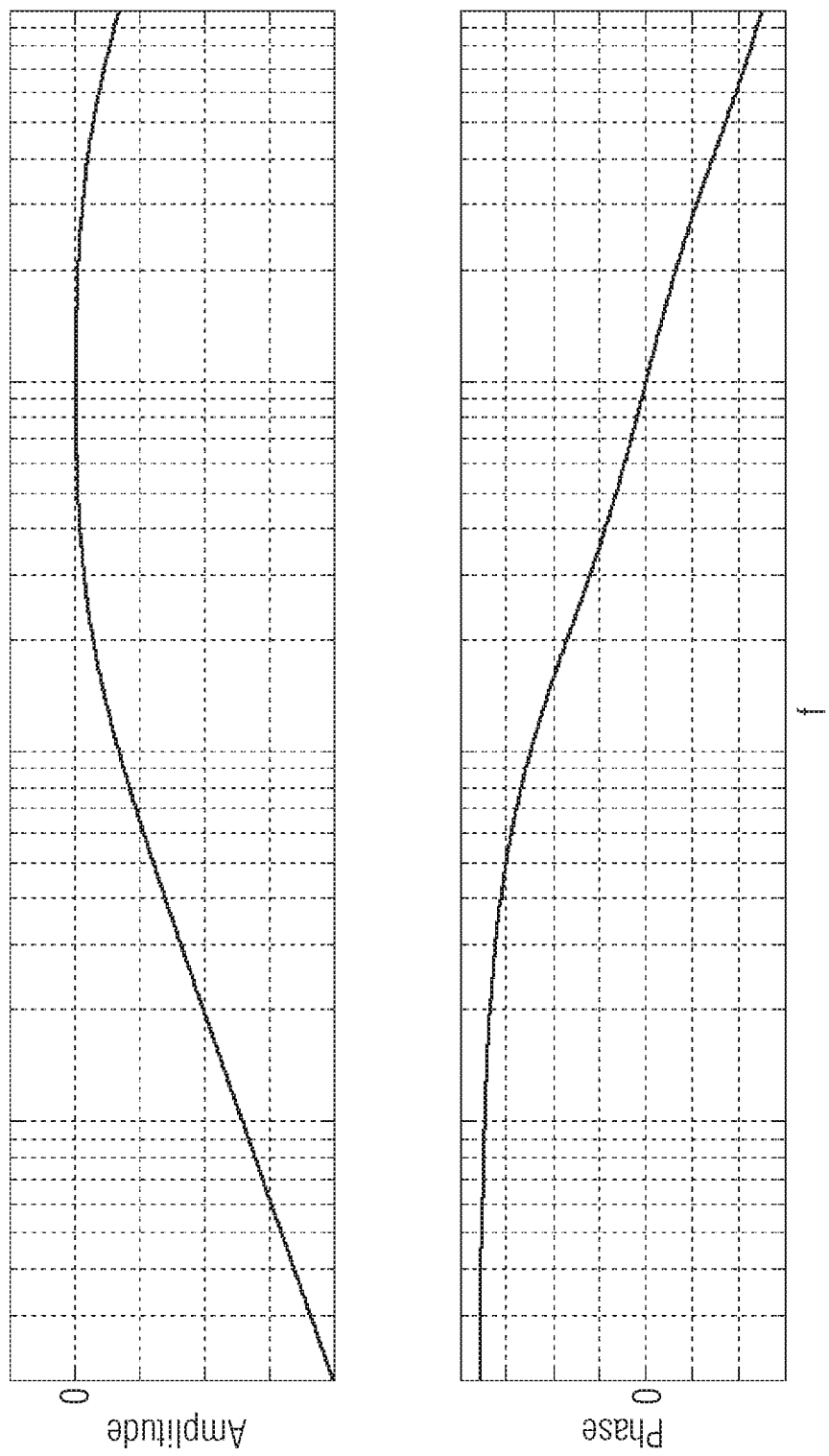
FIG. 3 shows an example of a transmission series of a filter for generating filtered current and voltage values.

In this context, FIG. 3 shows the transmission function (amplitude and phase response) of an example of a filter by means of which the relevant frequencies are filtered from the series of the current and voltage measured values for further analysis, wherein filtered current and voltage values are produced. An example of a passband of a suitable filter may be around 30 kHz to 400 kHz. In this range, conventional primary measuring transformers normally used in energy supply networks can transmit the signals with a quality sufficient for the fault location.

Figure 4:
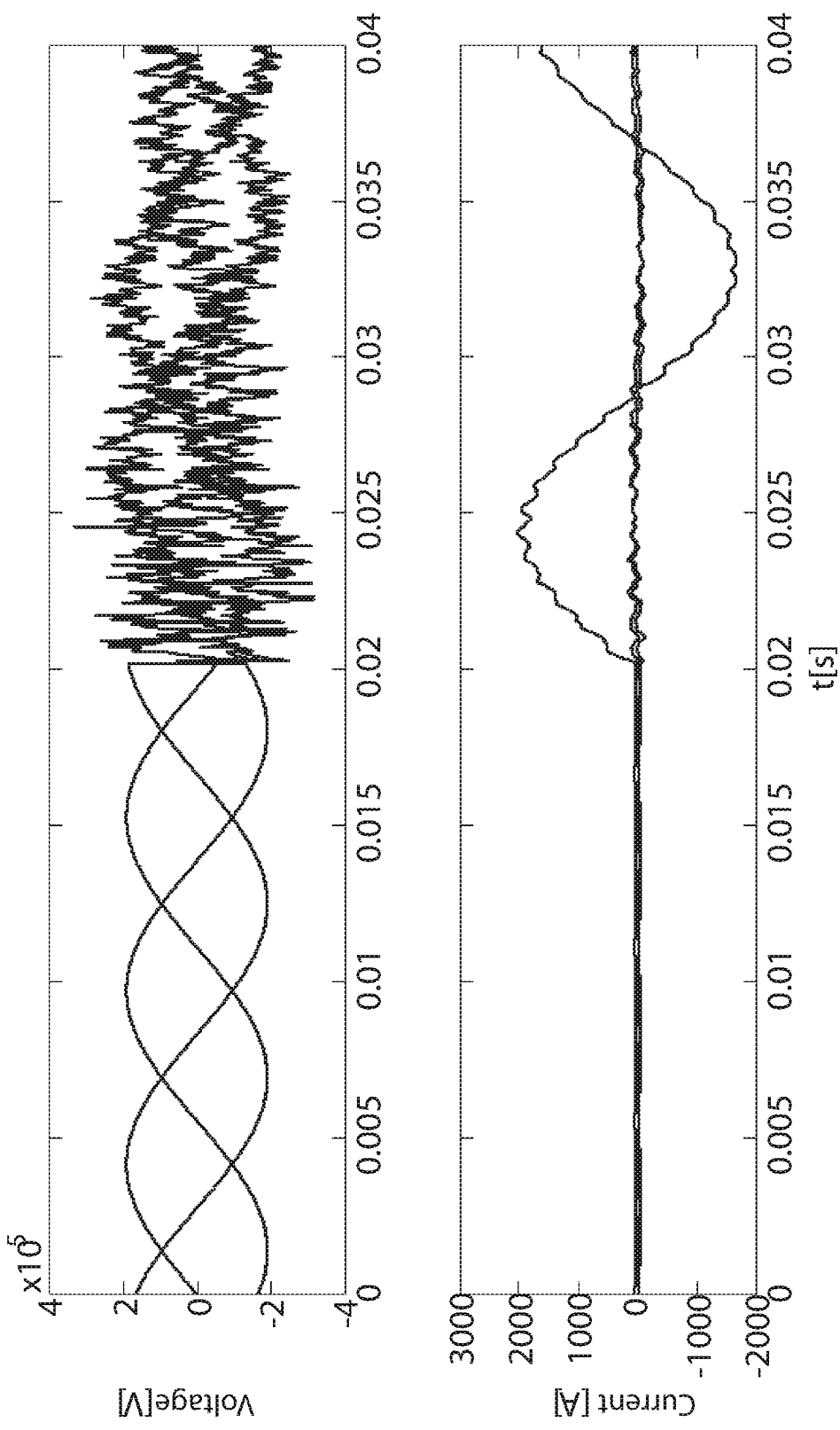
FIG. 4 shows examples of series of current and voltage measured values.
Figure 5:
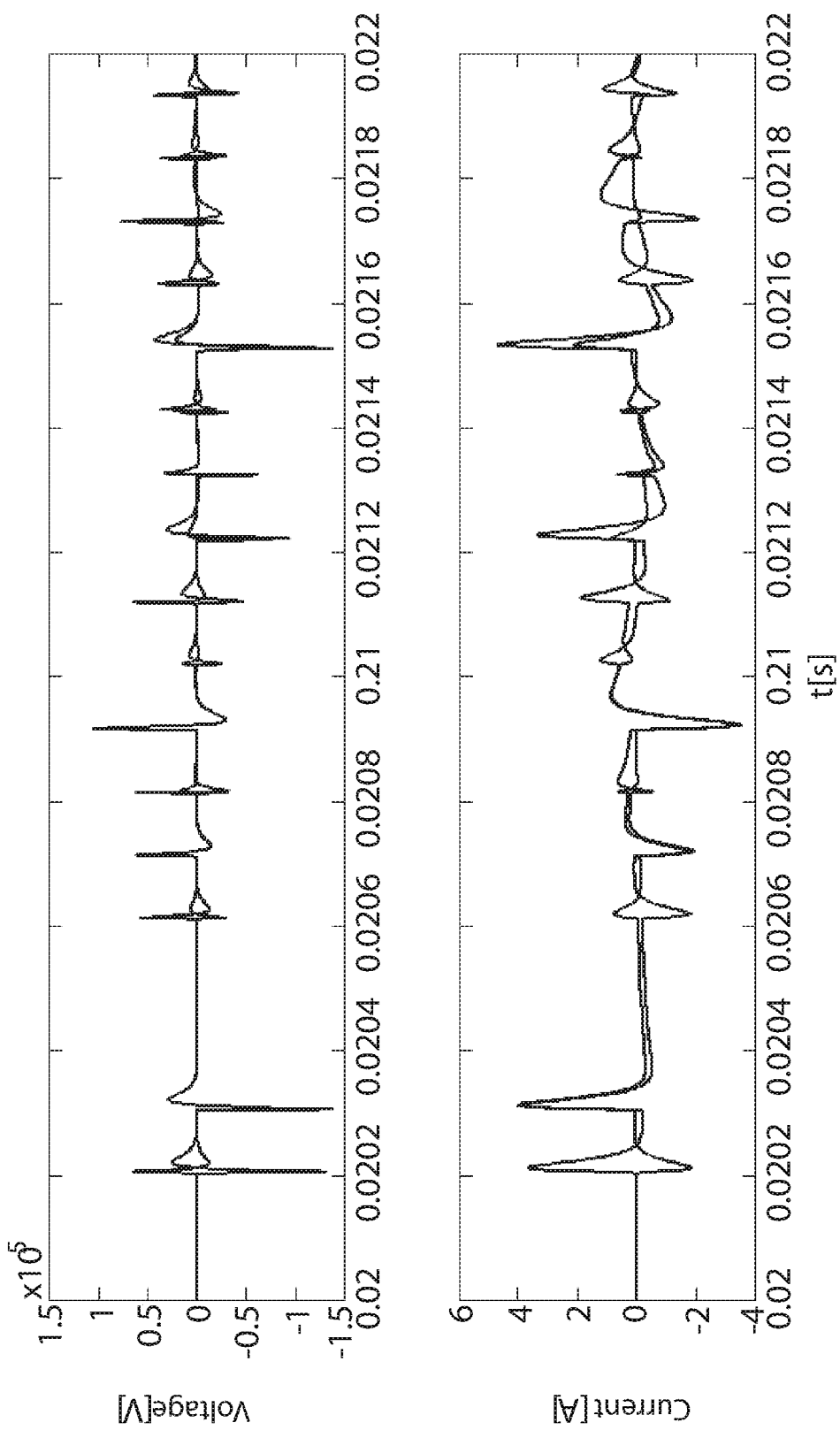
FIG. 5 shows examples of series of filtered current and voltage values.

FIGS. 4 and 5 show by way of example how the filter impacts on the recorded current and voltage measured values. FIG. 4 shows an example of a series of current and voltage measured values at a line end of a three-phase high-voltage line during a single-pole fault in phase A. The single-pole fault causes a rise in the current in the fault-affected phase A, whereas the voltage drops in phase A. Following the onset of the fault, the current and voltage signals contain high-frequency transients which are to be evaluated for the fault location.

The high-frequency transient components of the current and voltage measured values can be filtered out using a filter (for example a bandpass filter as described in connection with FIG. 2). This produces filtered current and voltage values as shown by way of example in FIG. 5. In considering the filtered current and voltage values, it should be noted that phases B and C that are unaffected by a fault have corresponding high-frequency patterns.

A fault at the fault location F of the line 11 (cf. FIG. 1) results in a division of the line 11 into two sections for which two voltage equations (19) and (20) can be obtained using equation (18):

$$U_{F,1}(x, j\omega) = U_1(j\omega)\cos h\gamma(j\omega)x - Z_c(j\omega) \cdot I_1(j\omega)\sin h\gamma(j\omega)x \quad (19)$$

$$U_{F,2}(l-x, j\omega) = U_2(j\omega)\cos h\gamma(j\omega)(l-x) - Z_c(j\omega) \cdot I_2(j\omega)\sin h\gamma(j\omega)(l-x) \quad (20)$$

Here, l represents the line length, $U_{F,1}$ the fault voltage at the fault location from the perspective of the first line end 11a and $U_{F,2}$ the fault voltage at the fault location from the perspective of the second line end 11b. $U_1$, $U_2$ and $I_1$, $I_2$ represent the measured voltages and currents at both line ends. These two voltages are equal for the correct fault location at distance x (seen from the first line end) or l-x (seen from the second line end). This condition is used for the fault location.

The lines in energy supply networks normally comprise at least three phase conductors. It is thus necessary to present equations (18) or (19) and (20) set out above in the form of a matrix. An equation system of this type can be simplified by means of a modal or eigenvalue transformation. This enables the individual equations of the resulting equation system to be decoupled from one another and thus to be considered independently from one another. In addition, this transformation enables the equations already obtained to be considered in transformed components.

By way of example, a simple symmetrical line having the following parameters for a rated frequency of 60 Hz will be considered below:

$$Z = \begin{bmatrix} 0.187 + j0.858 & 0.098 + j0.3705 & 0.098 + j0.3705 \\ 0.098 + j0.3705 & 0.187 + j0.858 & 0.098 + j0.3705 \\ 0.098 + j0.3705 & 0.098 + j0.3705 & 0.187 + j0.858 \end{bmatrix} \Omega \quad (21)$$

$$Y = 1e-5 \begin{bmatrix} j0.3 & -j0.036 & -j0.036 \\ -j0.036 & j0.3 & -j0.036 \\ -j0.036 & -j0.036 & j0.3 \end{bmatrix} S \quad (22)$$

Here, Z represents the line impedance and Y the line admittance. The "Clark transformation" is used by way of example as the modal transformation for decoupling. This has a transformation matrix T as follows; this produces α, β and 0 components:

$$T = \frac{2}{3} \begin{bmatrix} 1 & -0.5 & -0.5 \\ 0 & \frac{\sqrt{3}}{2} & -\frac{\sqrt{3}}{2} \\ 0.5 & 0.5 & 0.5 \end{bmatrix} \quad (23)$$

The afore-mentioned matrices (21) and (22) can be transformed with the Clark transformation as follows:

$$Z_{\alpha\beta 0} = \quad (24)$$

$$TZT^{-1} = \begin{bmatrix} 0.0894 + j0.487 & 0 & 0 \\ 0 & 0.0894 + j0.487 & 0 \\ 0 & 0 & 0.383 + j1.599 \end{bmatrix} \Omega$$

$$Y_{\alpha\beta 0} = TYT^{-1} = 1e-5 \begin{bmatrix} j0.336 & 0 & 0 \\ 0 & j0.336 & 0 \\ 0 & 0 & j0.229 \end{bmatrix} S \quad (25)$$

In conjunction with equations (13) and (14), this produces the three propagation constants (equation (26)) and wave impedances (equation (27)) which are to be considered:

$$\gamma_{\alpha\beta 0} = \begin{bmatrix} 0.0001 + j0.00128 & 0 & 0 \\ 0 & 0.0001 + j0.00128 & 0 \\ 0 & 0 & 0.0002 + j0.0019 \end{bmatrix} \quad (26)$$

$$Z_{C\alpha\beta 0} = \quad (27)$$

$$1e+2 \begin{bmatrix} 3.821 - j0.3475 & 0 & 0 \\ 0 & 3.821 - j0.3475 & 0 \\ 0 & 0 & 8.411 - j0.994 \end{bmatrix} \Omega$$

Figure 6:
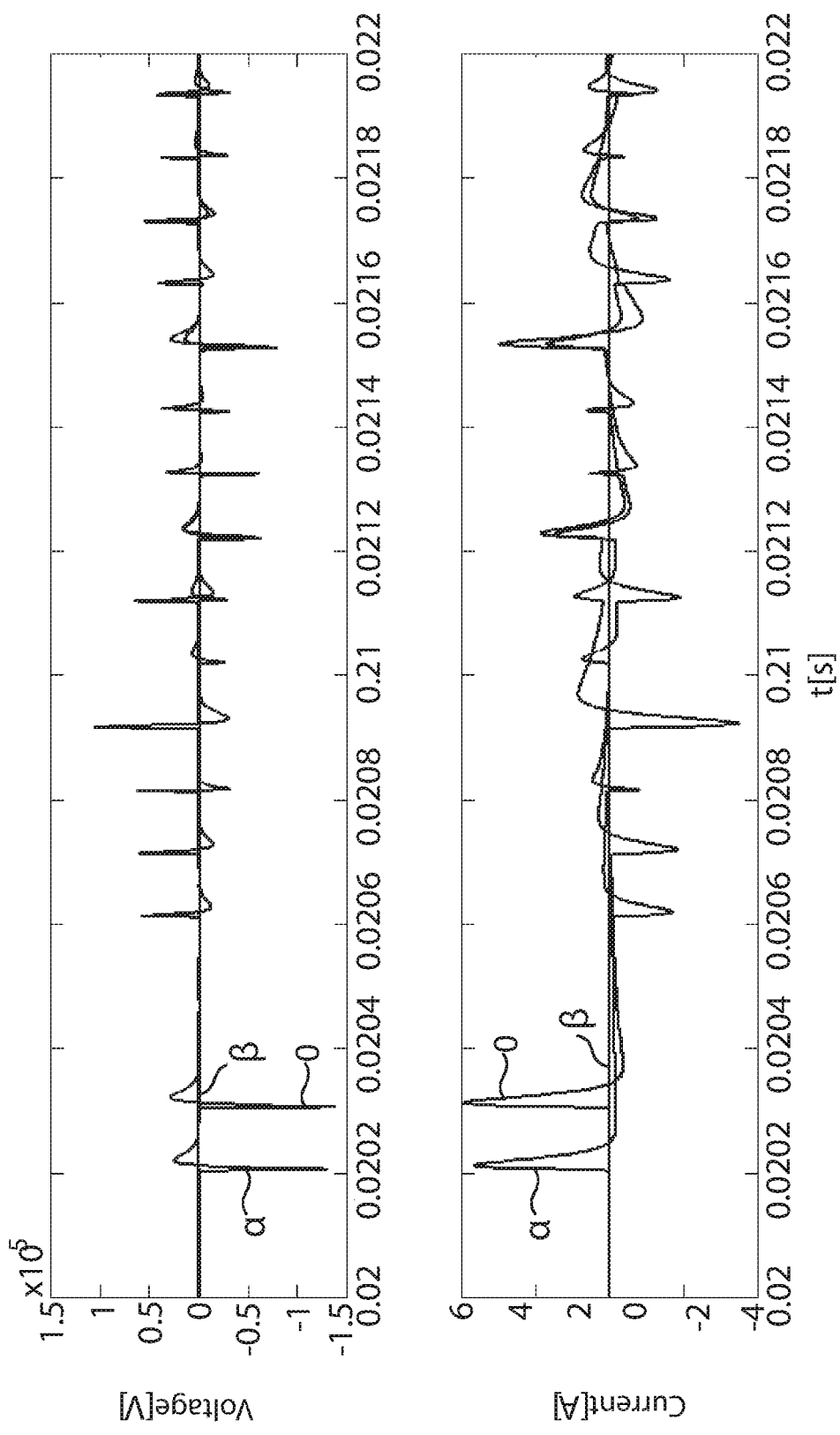
FIG. 6 shows examples of series of transformed current and voltage values generated from the filtered current and voltage values.

Through the analysis of the propagation constant γ, it is possible to infer which of the modal components has the highest speed, this being preferably used for the further analysis. In addition, the component which occurs to a sufficient extent in the signal must be evaluated. This depends heavily on the fault type. FIG. 6 shows the transformed current and voltage values produced from the filtered current and voltage values through transformation. These represent the actual traveling waves which are used for the fault location.

FIG. 6 shows that, in the example case of the single-pole fault in Phase A, the β component does not occur. It is furthermore evident that the 0 component is substantially slower than the α component.

Assuming that the fault location is known, the voltage $U_F$ at the fault location can be inferred separately from both line ends 11a, 11b.

Figure 7:
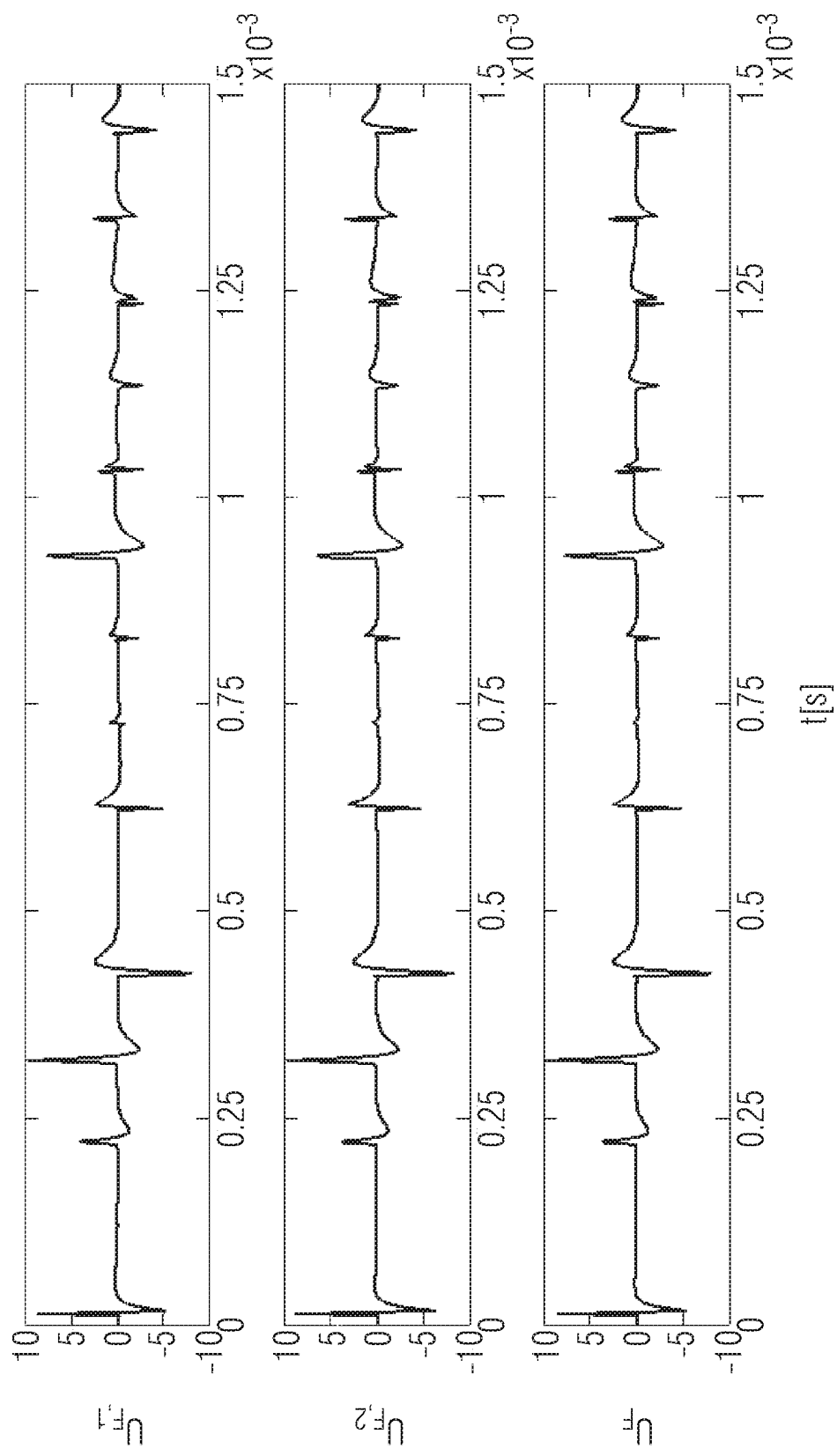
FIG. 7 shows examples of series of fault voltage values with synchronous measurements and a known fault location.

In conventional traveling wave fault location systems, the measured value recording takes place in a time-synchronized manner at both line ends 11a and 11b. The measured values are given a timestamp by means of which an exact allocation of the current and voltage measured values from both line ends can take place. A fault location can thus take place in a simple manner with synchronized measured value recording on the basis of equations (19) and (20). This case is shown by way of example in FIG. 7. It is evident that, at the correct fault location (distance x from the first line end 11k), the series of the fault voltage values UF,1 defined with the measured values from the first line end 11a corresponds to the series of the fault voltage values $U_{F,2}$ defined with the measured values from the second line end 11b. For comparison, the lower diagram in FIG. 7 shows the series of the fault voltage values $U_F$ which could be measured directly at the fault location. In the example shown in FIG. 7, all series of the fault voltage values are positioned in the same measurement window. This is possible only through a highly accurate temporal synchronization.

Figure 8:
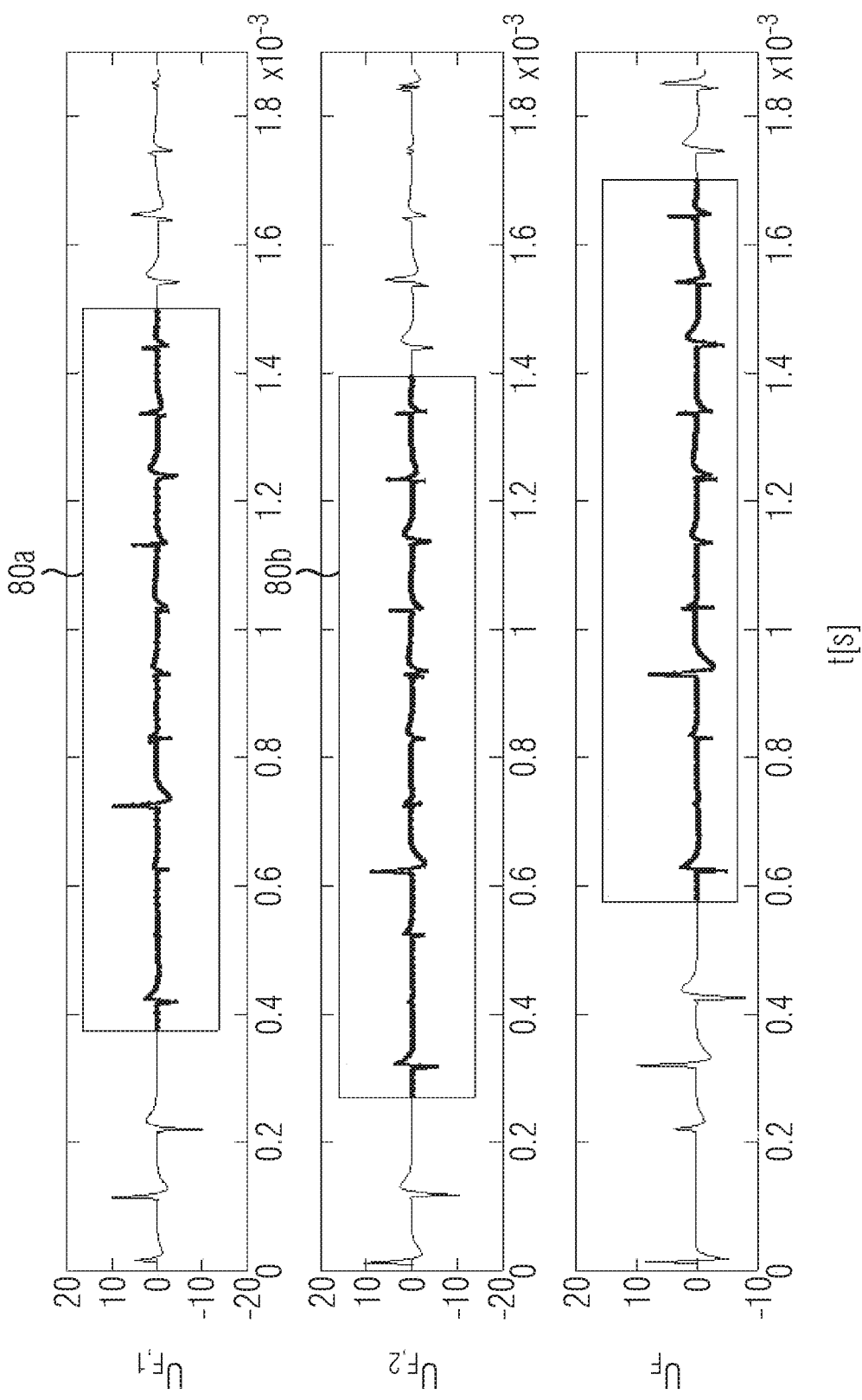
FIG. 8 shows examples of series of fault voltage values with non-synchronous measurements and a known fault location.

If no time synchronization of the measured value recording is available, the shape of the curves will not change if the fault location is known, but rather their temporal allocation; this is illustrated by way of example in FIG. 8. The measurement windows 80a, 80b with corresponding series of the fault voltage values are visually highlighted in FIG. 8 in the series of the fault voltage $U_{F,1}$, $U_{F,2}$ defined from the line ends 11a and 11b. For comparison, the lower diagram in FIG. 8 also shows the series of the fault voltage values $U_F$ which could be measured directly at the fault location. The accordingly corresponding measurement window 80c is visually highlighted in this series also. It is evident that the series contained in the measurement windows 80a, 80b, 80c occur temporally shifted in relation to one another, but have virtually identical patterns.

Figure 9:
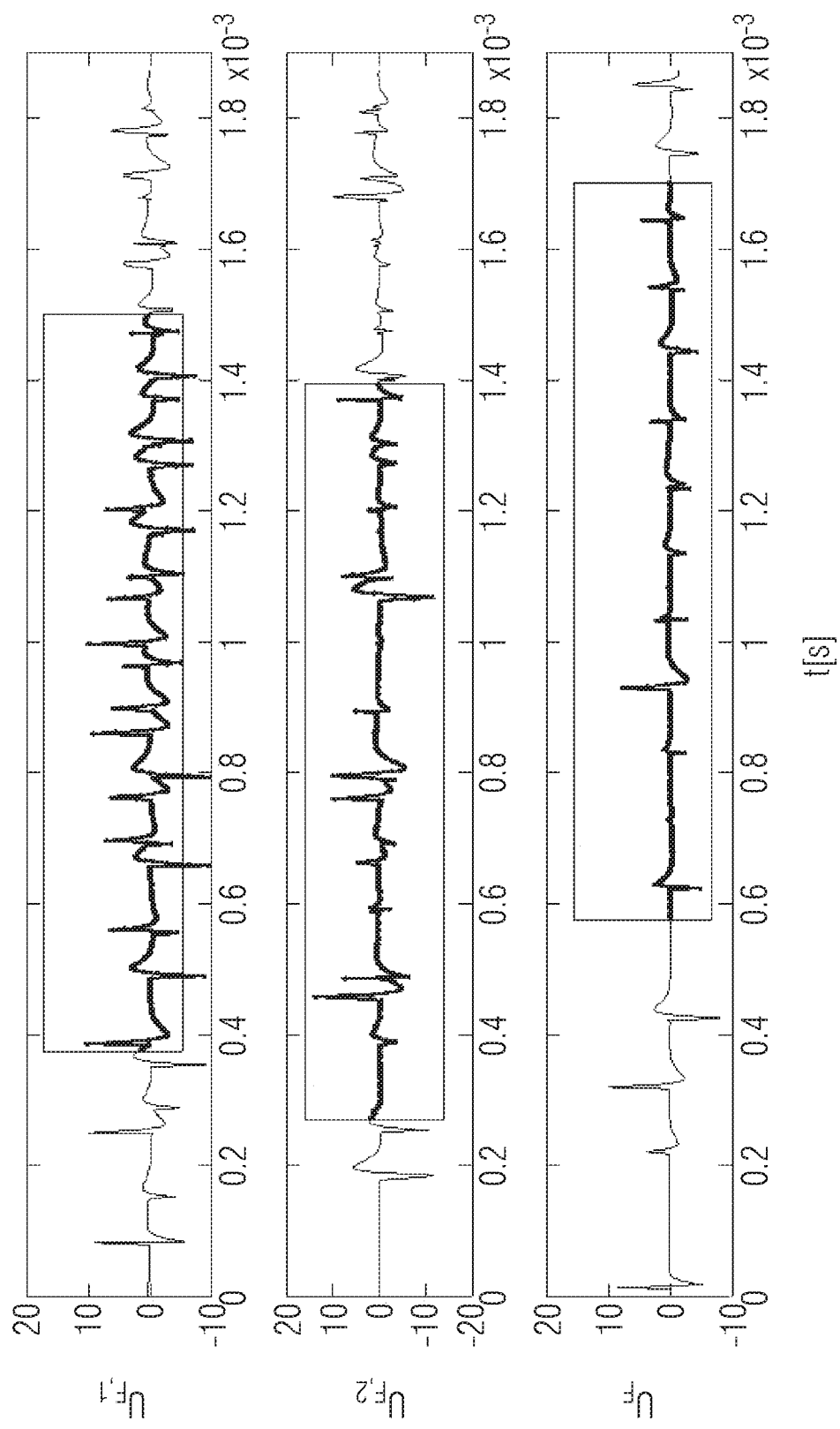
FIG. 9 shows examples of series of fault voltage values with non-synchronous measurements and a fictitious fault location which does not correspond to the actual fault location.

However, virtually identical patterns of this type can only be defined for the actual fault location; outside the actual fault location, significantly different patterns occur for the series of the fault voltage values $U_{F,1}$, $U_{F,2}$. This is shown by way of example in FIG. 9, in which the fault voltage series $U_{F,1}$, $U_{F,2}$ are shown for a fictitious fault location which does not correspond to the actual fault location. It is clearly evident in FIG. 9 that the fault voltage series $U_{F,1}$, $U_{F,2}$ defined from both line ends 11a, 11b have no corresponding patterns inside and outside the measurement windows selected for the analysis in FIG. 8. For comparison, the lower diagram in FIG. 8 also shows the series of the fault voltage values $U_F$ which could be measured directly at the actual fault location. Nor is there any evidence of correspondence between this series $U_F$ and the two fault voltage series $U_{F,1}$, $U_{F,2}$.

This finding that there is only one pattern for an actual fault location which can be calculated from both line ends and produces identical patterns in the respective fault voltage series $U_{F,1}$, $U_{F,2}$ is exploited below for the fault location definition. Consequently, a fault location must be found for which the fault voltage values defined from both line ends 11a, 11b correspond to one another sufficiently closely. This problem can be solved for an existing measured value synchronization by simply equalizing the two equations (19) and (20) to obtain the distance x which indicates the correct fault location.

However, in the absence of temporal synchronization of the measured value recording, the required pattern recognition is rendered more difficult.

In order to nevertheless be able to carry out a determination of the actual fault location, the finding that a shift in the calculated fault voltage series $U_{F,1}$, $U_{F,2}$ in each case by the propagation time of the traveling wave, i.e. the time that the traveling wave requires from the actual fault location to the respective line end 11a, 11b is exploited, results in the achievement of the same time basis.

In the time domain, the shift terms resulting for both line ends would be expressed as follows:

$$u_{F,1}\left(t - \frac{x}{v_{mode}}\right) \tag{28}$$

for the first line end 11a, and $$u_{F,2}\left(t - \frac{l-x}{v_{mode}}\right) \tag{29}$$

for the second line end 11b. Here, $v_{mode}$ is the speed of a respectively selected mode; l is the line length.

In the frequency domain, the corresponding following shift terms are obtained herefrom:

$$U_{F,1}(x,j\omega)e^{-\gamma(j\omega)x} \tag{30}$$

for the first line end 11a, and $$U_{F,2}(x,j\omega)e^{-\gamma(j\omega)(l-x)} \tag{31}$$

for the second line end 11b. In the frequency domain, the temporal shift is reflected in the multiplication by the complex exponential function.

If the respective shift term (30) and (31) is transferred to equations (19) and (20), this produces the following equations for the fault voltage series $U_{F,1}$, $U_{F,2}$:

$$U_{F,1}(x,j\omega)e^{-\gamma(j\omega)x} = U_1(j\omega)e^{-\gamma(j\omega)x} \cos h\gamma(j)x \ Z_c(j\omega) \cdot I_1 \\ (j\omega)e^{-\gamma(j\omega)x} \sin h\gamma(j\omega)x \tag{32}$$

$$U_{F,2}(l-x,j\omega)e^{-\gamma(j\omega)(l-x)} = U_2(j\omega)e^{-\gamma(j\omega)(l-x)} \cos h\gamma(j\omega)(l-x) - Z_c(j\omega) \cdot I_2(j\omega)e^{-\gamma(j\omega)(l-x)} \sin h\gamma(j\omega)(l-x) \tag{33}$$

Figure 10:
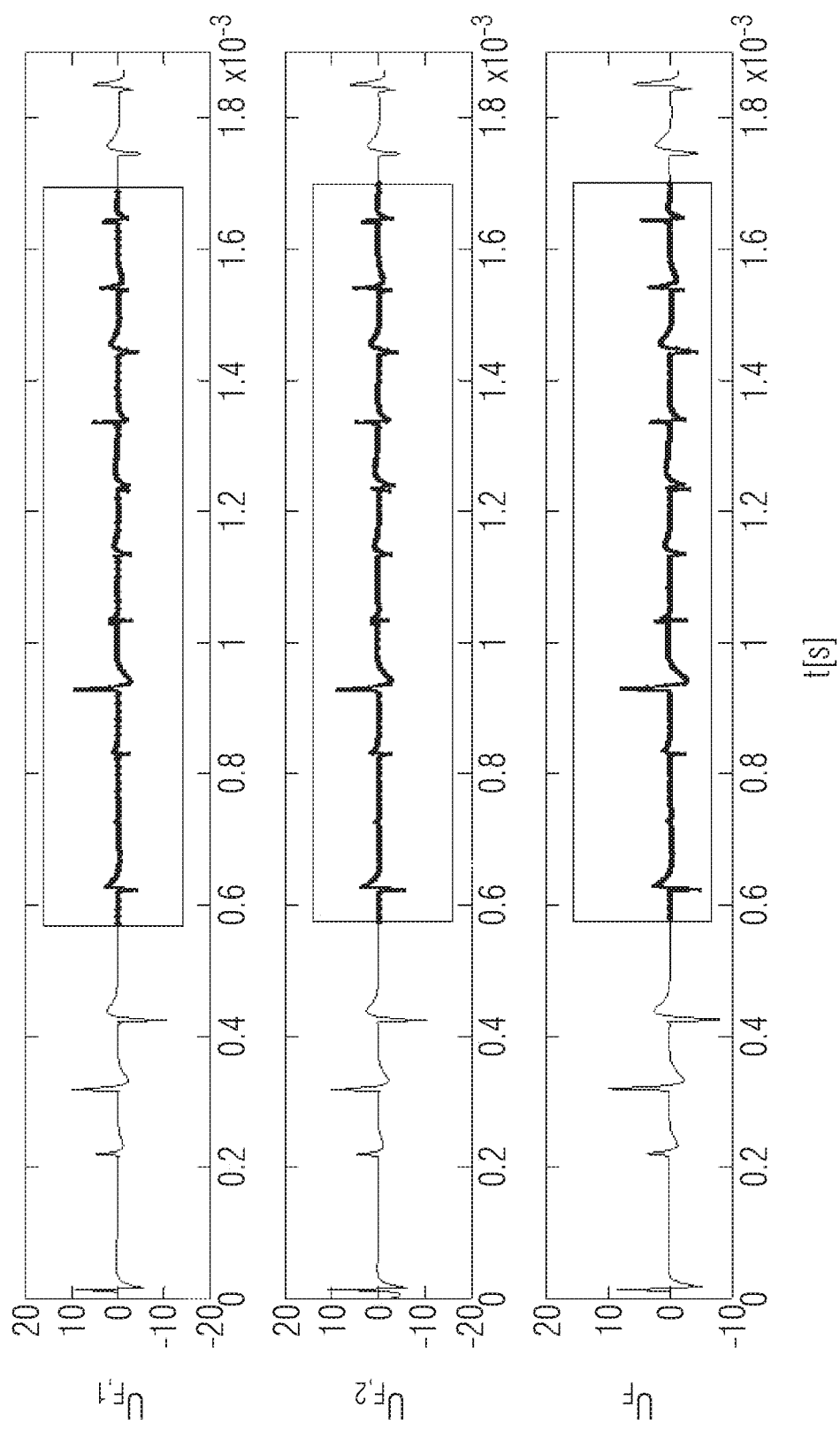
FIG. 10 shows examples of series of fault voltage values with non-synchronous measurements and a fictitious fault location which corresponds to the actual fault location.

The result of this temporal shift is shown by way of example in FIG. 10 for a known actual fault location; here, all of the voltage curves and measurement windows have been converted by the shift to the same time basis. For comparison, the lower diagram in FIG. 10 also shows the series of the fault voltage values $U_F$ which could be measured directly at the actual fault location.

However, since the actual fault location is initially unknown, the value for x which provides the closest correspondence of the two fault voltage series $U_n$, $U_{F,2}$ must be found.

In other words, on the one hand, the series of the fault voltage values $U_{F,1}$ according to equation (32) must first be defined for a first fictitious or assumed fault location and, on the other hand, the series of the fault voltage values $U_{F,2}$ according to equation (33) must first be defined for the same fictitious or assumed fault location. If the two series correspond to one another, the first fictitious fault location would correspond to the actual fault location. If no correspondence exists, the same procedure must be carried out for a second fictitious fault location. The procedure is continued until a correspondence of the two fault voltage series $U_{F,1}$, $U_{F,2}$ is identified for a fictitious fault location; this fictitious fault location then corresponds to the actual fault location.

Such a manual search for the fault location is comparatively costly; furthermore, the series of the fault voltage values $U_{F,1}$, $U_{F,2}$ cannot normally be expected to be exactly identical in reality due to measurement and calculation inaccuracies and the line parameters that are used.

The procedure described above can therefore be advantageously replaced with a mathematical optimization method in which a target function is defined with which the closest correspondence of the two fault voltage series can be determined depending on the fault location. The distance x of the fault location from the first line end 11a can be used as a parameter for the target function. The following therefore applies to the actual fault location:

$$(U_{F,1}(x,j\omega)e^{-\gamma(j\omega)x} - U_{F,2}(l-x,j\omega)e^{-\gamma(j\omega)(l-x)}) \approx 0 \tag{34}$$

Different target functions can be defined in order to satisfy the condition of equation (34). A possible target function $ZF_1$, in which a minimization takes place for the optimization, is indicated below by equation (35):

$$ZF_1 = \min \int_\omega (U_{F,1}(x, j\omega)e^{-\gamma(j\omega)x} - U_{F,2}(l-x, j\omega)e^{-\gamma(j\omega)(l-x)})^2 \quad (35)$$

Figure 11:
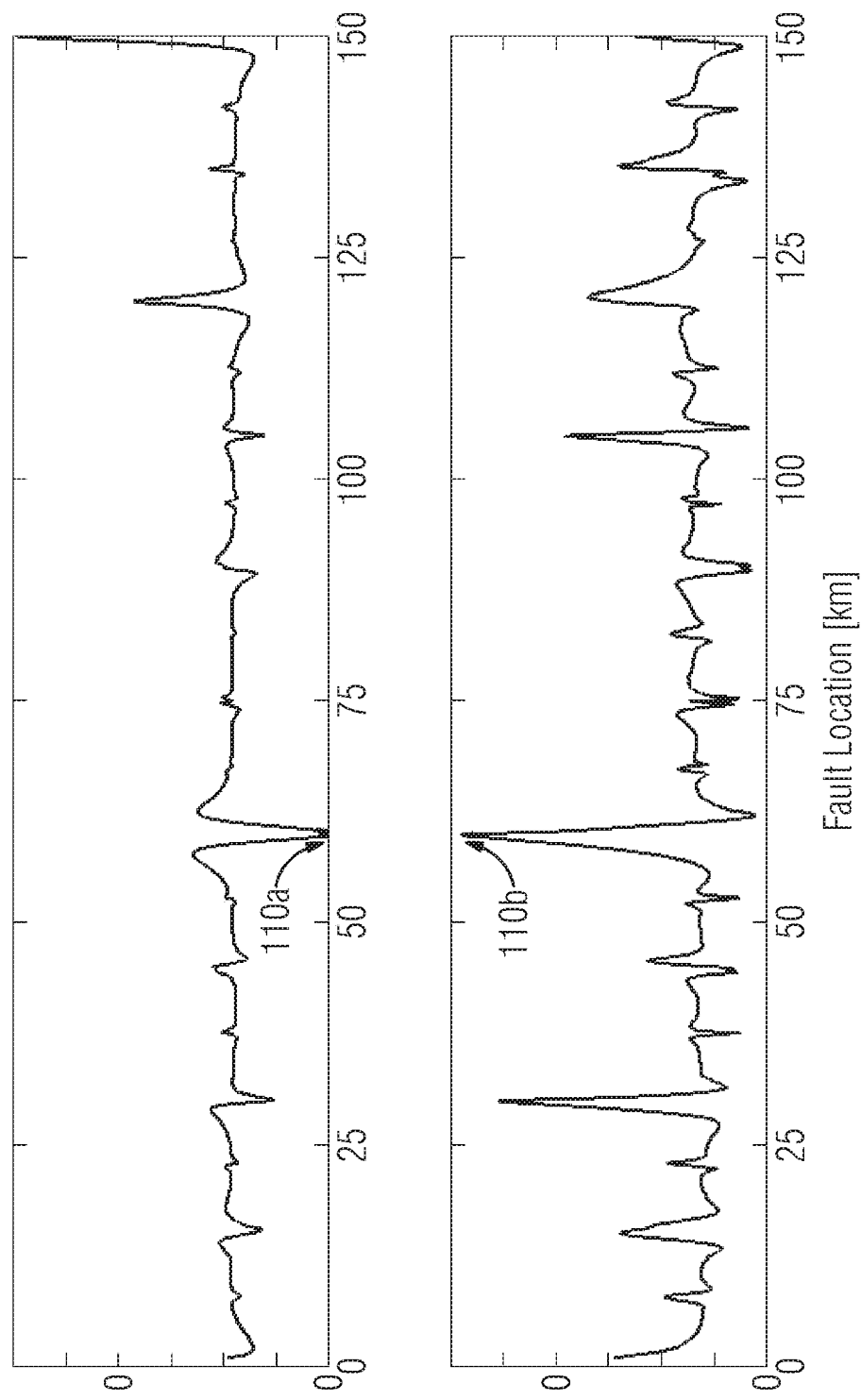
FIG. 11 shows examples of series of target functions for fault location.

The series of the target function $ZF_1$ is shown by way of example in the upper diagram in FIG. 11 for the case of a single-pole fault with a distance x=60 km from the first line end 11a. In this case, the line length is assumed to be 150 km, resulting in a minimum 110a in the diagram for a distance of the fault location from the first line end 11a of x=60 km from the second line end 11b of (l-x)=90 km.

Another possible target function $ZF_2$, in which a maximization takes place for the optimization, is indicated below by equation (36):

$$ZF_2 = \max \int_\omega (U_{F,1}(x, j\omega)e^{-\gamma(j\omega)x} \cdot (U_{F,2}(l-x, j\omega)e^{-\gamma(j\omega)(l-x)})^*) \quad (36)$$

The complex-conjugate expression is designated by the asterisk *. The series of the target function $ZF_2$ is shown by way of example in the lower diagram in FIG. 11 similarly for the case of a single-pole fault with a distance x=60 km from the first line end 11a. The diagram shows a maximum 110b for a distance of the fault location from the first line end 11a of x=60 km and from the second line end 11b of (l-x)=90 km.

Equations (35) and (36) represent examples of target functions which must be subjected to a minimization or maximization process. This can be achieved, for example, by a mathematical iterative method. The minimization or maximization process can be carried out in both the frequency domain and the time domain, wherein the calculation of the fault voltage series preferably takes place in the frequency domain. Since digital devices such as the devices 15a, 15b normally operate with discrete values, the methods can be adapted according to this requirement.

Figure 12:
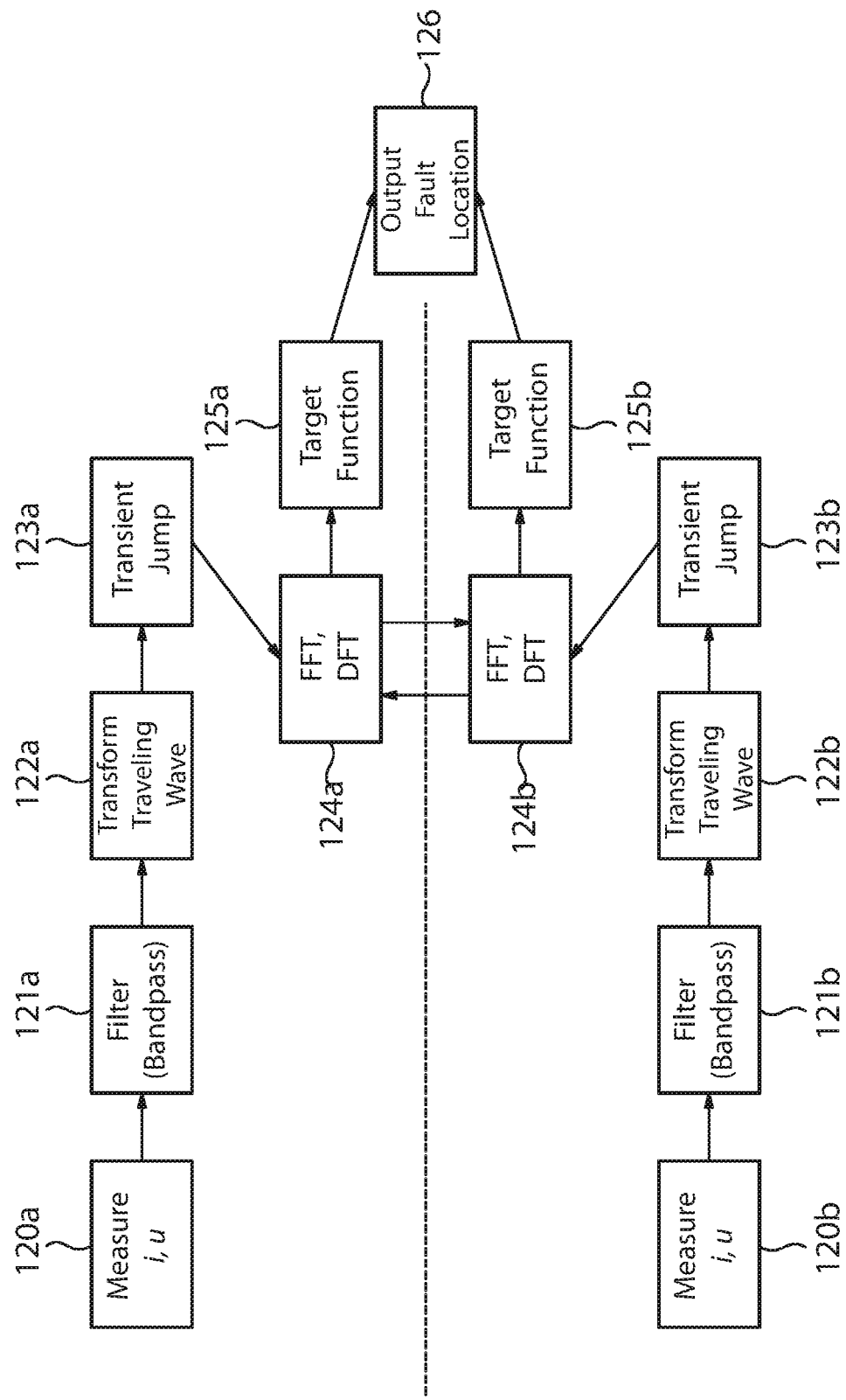
FIG. 12 shows a schematic view of a flow diagram to explain an example embodiment of a method for fault location.

FIG. 12 finally shows a schematic flow diagram of an exemplary embodiment of a method for determining a fault location. The method steps above the dotted line take place in the device 15a at the first line end 11a, while those below the dotted line take place in the device 15b at the second line end 11b (cf. FIG. 1).

The local currents and voltages are measured in each case with the devices 15a, 15b at both line ends in steps 120a and 120b and corresponding current and voltage measured values are produced. These measured values are present as sampling values of the current and voltage signals of the line 11. An example of the recorded current and voltage measured values is shown in FIG. 4.

So that only the high-frequency transient components (traveling waves) of the respective current and voltage measured values are recorded, a filtering (e.g. by a bandpass filter) takes place in each case in steps 121a and 121b. Through the selection of the cut-off frequencies, e.g. of the bandpass filter, the method can be adapted to the series of the transformers 13a, 13b and 14a, 14b. If these transformers provide only a medium bandwidth, e.g. up to 10 kHz only, the filters must limit the bandwidth of the signals to the bandwidth of the transformers used. Depending on the phase error of the transformers used, a slightly lower measurement accuracy can then be expected. If the transformers can provide a higher bandwidth, e.g. up to 500 kHz, the filters should be dimensioned accordingly.

In steps 121a, 121b, filtered current and voltage values are generated, as shown by way of example in FIG. 5. An example of a transmission series of a suitable filter is shown in FIG. 3.

In steps 122a and 122b, the respective traveling waves are treated in each case by means of a transformation (e.g. Clarke transformation), e.g. in order to decouple the phase-related components. Transformed current and voltage values are generated, as shown by way of example in FIG. 6.

In order to start the fault location method or to position the measurement window correctly for the evaluation only if required, i.e. in the event of a fault, a transient jump, which is used e.g. as a trigger for the measurement window positioning, can furthermore be determined in each case for each side in steps 123a and 123b. The length of the measurement window should preferably be at least twice the propagation time of the traveling wave in the selected modal component. The jump detection can take place in relation to the transformed or filtered current and voltage values or in relation to the original current and voltage measured values.

A transfer of the transformed current and voltage values into the frequency domain takes place in steps 124a and 124b. This is preferably performed by means of Fast Fourier Transform (FFT) or Discrete Fourier Transform (DFT).

As indicated by the arrows between the blocks of steps 124a and 124b, the resulting values are exchanged in the frequency range between the devices 15a and 15b (cf. FIG. 1). This is performed via the communication connection 16.

With their own values and the values from the respective other line end, the devices 15a and 15b then perform a fault location search by means of optimization of a target function, as described above, in steps 125a and 125b. The target function can be processed, for example, in steps 125 and 125b according to equations (35) or (36). As described above, a fictitious fault location is sought for which the target function has a minimum or a maximum. This fictitious fault location is then accepted as the actual fault location.

The determined fault location is then output in step 126. According to FIG. 12, this takes place in a joint output step. Instead, a separate output can also be performed by each of the two devices 15a and 15b.

The devices 15a and 15b normally have a processing device in which steps 120a/b to 126 are carried out. This may be e.g. a microprocessor which accesses corresponding device software which is located in a memory of the respective device. Alternatively, it may also be a processing module with hardware-defined programming, for example, an ASIC or FPGA.

FIGS. 1 and 12 have shown a system for determining a fault location in which the fault location is determined with two devices 15a and 15b which are located in each case at one line end 11a or 11b. Instead, a central device can also be provided, to which the current and voltage measured values from the line ends are fed.

Once more to briefly summarize, the invention relates to a method for determining the fault location F of a fault on a line 11 of an electrical energy supply network, in which first current and voltage values are measured at a first line end 11a of the line 11, second current and voltage values are measured at a second line end 11b of the line 11, and the fault location F of said fault is defined using the first and second current and voltage values following the occurrence of a fault on the line 11.

In order to be able to perform a fault location with measured values from both line ends with high accuracy even in the absence of temporal synchronization of the measurements at the line ends, it is proposed that a series of first fictitious fault voltage values present at a fictitious fault location on the line 11 is defined using the first current and voltage values, a series of second fictitious fault voltage values present at a fictitious fault location on the line 11 is defined using the second current and voltage values, a fictitious fault location of this type on the line 11 is determined for which the series of the first fictitious fault voltage values corresponds most closely to the series of the second fictitious fault voltage values, and the determined fictitious fault location is used as the fault location F of the fault on the line 11.

Although the invention has been illustrated and described in detail above through preferred example embodiments, the invention is not restricted to the disclosed examples, and other variations can be derived herefrom by the person skilled in the art without exceeding the protective scope of the following patent claims.

The invention claimed is:

1. A method for determining a fault location of a fault on a line of an electrical energy supply network, the method comprising:
    measuring, with a first measuring device, first current and voltage values at a first line end of the line;
    measuring, with a second measuring device, second current and voltage values at a second line end of the line;
    defining a series of first fictitious fault voltage values present at a fictitious fault location on the line using the first current and voltage values and a propagation model for traveling waves on the line;
    defining a series of second fictitious fault voltage values present at the fictitious fault location on the line using the second current and voltage values and the propagation model for traveling waves on the line;
    determining the fictitious fault location of the type on the line for which the series of the first fictitious fault voltage values corresponds most closely to the series of the second fictitious fault voltage values by way of an optimization method wherein the fictitious fault location is used as an optimization parameter of a target function of the optimization method, and thereby
        defining the fictitious fault location for which a minimum of the difference between the series of the first fictitious fault voltage values and the series of the second fictitious fault voltage values is present with the target function; or
        defining the fictitious fault location for which a maximum of the product of the series of the first fictitious fault voltage values and the complex-conjugate series of the second fictitious fault voltage values is present with the target function; and
    defining the fault location of the fault on the line, and thereby using the fictitious fault location as the fault location of the fault on the line.

2. The method according to claim 1, wherein the optimization method is an iterative optimization method.

3. The method according to claim 1, which comprises:
    subjecting the respective current and voltage values measured at the line ends to filtering by a filter, and forming first and second filtered current and voltage values which represent a selected frequency range of the measured current and voltage values; and
    defining the fictitious first and second fault voltage values using the first and second filtered current and voltage values.

4. The method according to claim 3, wherein the selected frequency range comprises high-frequency transient components or band-limited transient components of the measured current and voltage values.

5. The method according to claim 3, wherein the electrical energy supply network is a multiphase electrical energy supply network and the method comprises:
    in respect of the first and second filtered current and voltage values, performing a mathematical transformation to decouple individual phase components to thereby form first and second transformed current and voltage values; and
    defining the fictitious first and second fault voltage values using the first and second transformed current and voltage values.

6. The method according to claim 1, which comprises determining the fault location if a jump which exceeds a predefined threshold has been identified in the series of the first current and voltage values or values derived therefrom and/or in the series of the second current and voltage values or values derived therefrom.

7. The method according to claim 1, which comprises:
    determining the fault location with a device configured therefor; and
    outputting the fault location so determined with the device.

8. The method according to claim 1, which comprises:
    determining the fault location in each case by way of a respective device at each of the line ends; and
    outputting with the devices the fault locations determined by way of the devices.

9. A device for determining a fault location of a fault on a line of an electrical energy supply network, the device comprising:
    a processing device configured to receive first current and voltage values measured at a first line end of the line and second current and voltage values measured at a second line end of the line and, following the occurrence of a fault on the line, to determine the fault location of the fault using the first current and voltage values and the second current and voltage values, wherein:
    said processing device is configured to define a series of first fictitious fault voltage values present at a fictitious fault location on the line using the first current and voltage values and a propagation model for traveling waves on the line;
    said processing device is configured to define a series of second fictitious fault voltage values present at the fictitious fault location on the line using the second current and voltage values and the propagation model for traveling waves on the line; and
    said processing device is configured to determine a fictitious fault location of this type on the line for which the series of the first fictitious fault voltage values corresponds most closely to the series of the second fictitious fault voltage values, defining the fictitious fault location for which a minimum of the difference between the series of the first fictitious fault voltage values and the series of the second fictitious fault voltage values is present with the target function; or
    defining the fictitious fault location for which a maximum of the product of the series of the first fictitious fault voltage values and the complex-conjugate series of the second fictitious fault voltage values is present with the target function, and to indicate the determined fictitious fault location as the fault location of the fault on the line.

10. The device according to claim 9, wherein the device is an electrical protection device.

11. The device according to claim 9, wherein the device is a separate fault-localizing device.

12. A system for determining a fault location of a fault on a line of an electrical energy supply network, the system comprising:
two devices each configured according to claim 9; and
a communication connection interconnecting said two devices for exchanging data therebetween.

13. A method for determining a fault location of a fault on a line of a multiphase electrical energy supply network, the method comprising:
measuring, with a first measuring device, first current and voltage values at a first line end of the line;
measuring, with a second measuring device, second current and voltage values at a second line end of the line;
subjecting the respective current and voltage values measured at the line ends to filtering by a filter, and forming first and second filtered current and voltage values which represent a selected frequency range of the measured current and voltage values, performing a mathematical transformation to decouple individual phase components to thereby form first and second transformed current and voltage values;
defining a series of first fictitious fault voltage values present at a fictitious fault location on the line using the first transformed current and voltage values and a propagation model for traveling waves on the line;
defining a series of second fictitious fault voltage values present at the fictitious fault location on the line using the second transformed current and voltage values and the propagation model for traveling waves on the line;
determining a fictitious fault location of the type on the line for which the series of the first fictitious fault voltage values corresponds most closely to the series of the second fictitious fault voltage values, by:
defining the fictitious fault location for which a minimum of the difference between the series of the first fictitious fault voltage values and the series of the second fictitious fault voltage values is present with the target function; or
defining the fictitious fault location for which a maximum of the product of the series of the first fictitious fault voltage values and the complex-conjugate series of the second fictitious fault voltage values is present with the target function; and
defining the fault location of the fault on the line, and thereby using the fictitious fault location as the fault location of the fault on the line.

* * * * *